United States Patent [19]
Thomas

[11] 4,402,771
[45] Sep. 6, 1983

[54] SUBSTRATE FOR SILICON SOLAR CELLS

[75] Inventor: Donald E. Thomas, Mt. Lebanon, Pa.

[73] Assignee: Westinghouse Electric Corp., Pittsburgh, Pa.

[21] Appl. No.: 358,072

[22] Filed: Mar. 15, 1982

Related U.S. Application Data

[62] Division of Ser. No. 16,766, Mar. 2, 1979, Pat. No. 4,343,963.

[51] Int. Cl.³ ............................................. H01C 31/06
[52] U.S. Cl. ..................................... 148/174; 29/572; 148/175; 156/613; 156/DIG. 69; 427/74; 427/75; 427/86; 427/253
[58] Field of Search .......... 29/572; 156/613, DIG. 69; 148/174, 175; 427/74, 75, 86, 253

[56] References Cited

U.S. PATENT DOCUMENTS 3,911,194 10/1975 Dejachy et al. ..................... 427/253
3,961,997 6/1976 Chu ..................................... 156/613

OTHER PUBLICATIONS

Chu et al., "Polycrystalline Silicon on Coated Steel Substrate", Electrochemical Society, vol. 122, pp. 1681-1685, (1975).

Bryant, "The Adherence of Chemically Vapor Deposited Tungsten Coatings", Chem. Vap. Deposition, Second Int. Conf., Electrochemical Soc., pp. 409-421, (1970).

Faron et al., "Study of the Chemical Vapor Deposition of Tungsten and Molybdenum-Reduction of Flourides at High Temperature and Low Pressure", Third Int. Conf. on Chem. Vapor Deposition, Proceedings of American Nuclear Society, pp. 435-452, (1972).

Nicolet, "Diffusion Barriers in Thin Fibers", Thin Solid Films, vol. 52, (1978), pp. 415-443.

*Primary Examiner*—John D. Smith
*Attorney, Agent, or Firm*—R. D. Fuerle

[57] ABSTRACT

A substrate is made for silicon solar cells by heating a sheet of large-grained silicon steel at a temperature of at least about 1300° C. in an atmosphere of hydrogen and tungsten hexafluoride (or hexachloride) at a partial pressure ratio of hydrogen to tungsten hexafluoride of about 3 to about 6 to deposit an epitaxial layer of tungsten on said sheet of silicon steel. Epitaxial silicon can then be deposited in a conventional manner on the layer of epitaxial tungsten.

11 Claims, 1 Drawing Figure

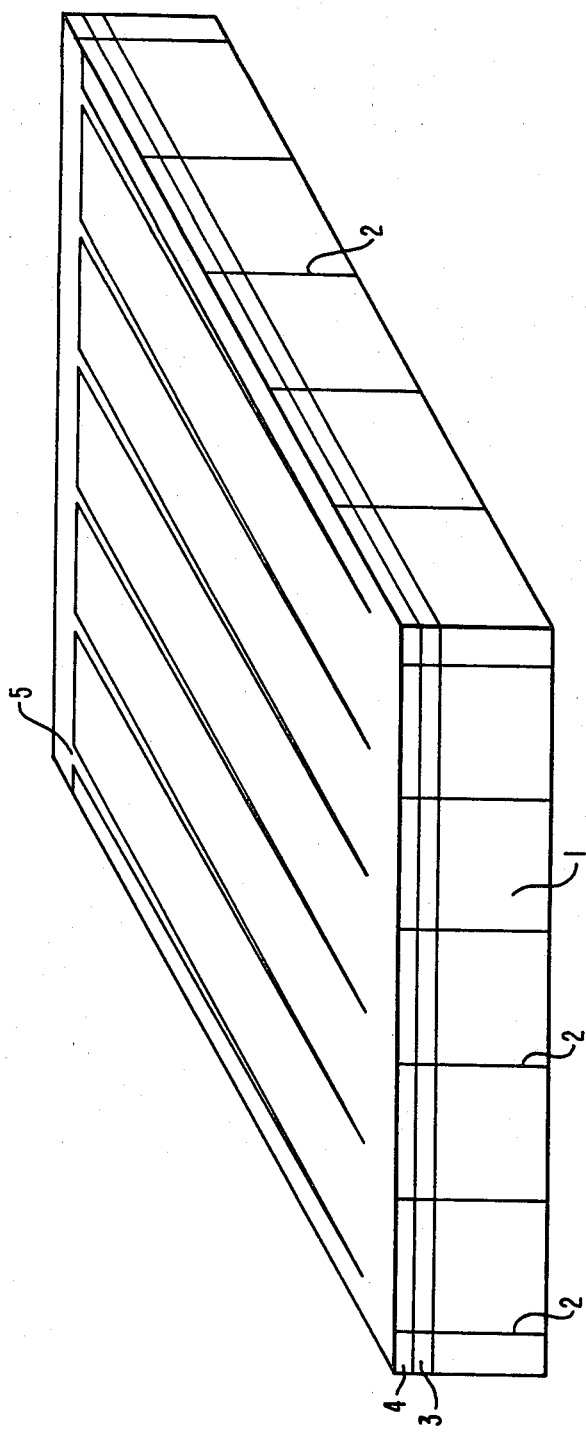

SUBSTRATE FOR SILICON SOLAR CELLS

This is a division of application Ser. No. 016,766, filed Mar. 2, 1979, now U.S. Pat. No. 4,343,963.

BACKGROUND OF THE INVENTION

Silicon solar photovoltaic cells are routinely produced for specialized applications such as satellite power supplies. Such cells have an efficiency on the order of 18%, but are far too expensive for economical terrestial power generation. The cells are made of single crystal silicon and their high cost is due to the large amount of single crystal silicon used in them. Only about the top 50 $\mu$m of the silicon in these cells is used to generate electricity, however--the remaining 150 to 300 $\mu$m being present only to serve as a supporting substrate for the top active layer. Much effort has been made to find inexpensive substrates which can be used to replace the inactive portion of the silicon, but so far these efforts have not been successful.

One of the substrates which was tried was steel, which was attractive due to its low cost. However, it was found that iron diffused from the steel into the silicon layer, rendering it ineffective. An attempt was made to prevent this diffusion by the deposition of a tungsten barrier layer in between the steel and the silicon, but iron diffusion still occurred through the grain boundaries of the very fine grained tungsten deposit.

PRIOR ART

An article entitled "Polycrystalline Silicon on Coated Steel Substrates," by T. L. Chu, H. C. Mollenkopf, and Shirley S. Chu in ELECTROCHEMICAL SOCIETY, Vol. 122, pgs. 1681 to 1685 (1975), discloses that a layer of tungsten between a steel substrate and a silicon surface is ineffective to prevent the diffusion of iron into the silicon.

An article entitled "The Adherence of Chemically Vapor Deposited Tungsten Coatings," by W. A. Bryant in "Chemical Vapor Deposition, Second International Conference, Electrochemical Society," pgs. 409 to 421 (1970), describes the coating of iron with tungsten in an atmosphere of hydrogen and tungsten hexafluoride at 900° to 1560° K.

An article entitled "Study of the Chemical Vapor Deposition of Tungsten and Molybdenum-Reduction of Fluorides at High Temperature and Low Pressure," by R. Faron et al., in "The Third International Conference on Chemical Vapor Deposition, Proceedings of the American Nuclear Society," pgs. 439 to 452 (1972) describes the epitaxial deposition of tungsten from WF$_6$ and H$_2$ at 1200° to 2000° C. and various ratios of hydrogen to tungsten hexafluoride.

SUMMARY OF THE INVENTION

I have discovered that steel can be used as a substrate for silicon, if a tungsten barrier is used, provided the steel is large-grained silicon steel and the tungsten is epitaxial. The substrate of this invention does not contaminate the silicon to any extent which would render the silicon layer ineffective. The substrate is very inexpensive and can be substituted for up to 90% of the silicon that was formerly used as a substrate.

DESCRIPTION OF THE INVENTION

The accompanying drawing is an isometric view in section of a certain presently preferred embodiment of a silicon solar cell employing a substrate according to this invention.

In the drawing, a sheet of large-grained silicon steel 1 having grain boundaries 2 supports a layer of epitaxial (i.e., having the same crystallographic orientation and grain size as the steel) tungsten 3. A layer of epitaxial silicon 4 containing a p-n junction is on the layer of tungsten. Said silicon layer has a grain size equal to that of the tungsten layer. A current-collecting grid 5 is mounted on the silicon. Light striking the silicon generates a current which flows through grid 5 and steel 1.

The steel used in this invention must be large-grained silicon steel because the large-grain size is necessary to epitaxially deposit large grain-sized tungsten and silicon, and only silicon steel has a sufficiently large grain size. Silicon steel is an iron-silicon alloy containing minor quantities of other elements. It is commercially prepared by known processes so that it is highly oriented with large grain sizes, on the order of 1 cm$^2$. The grain size (diameter) should be at least ten times as large as the thickness of the layer of silicon.

This type of steel can be heated to the high temperatures needed for deposition of the tungsten without undergoing a change in crystal structure as do other types of steel. The silicon steel must contain at least about 2.5% by weight silicon in order to retain its crystal structure at the tungsten deposition temperature, but should not contain more than about 5% by weight silicon as it then becomes difficult to fabricate. Suitable examples of silicon steel include regular grain-oriented silicon steel, high permeability silicon steel, and cube-oriented silicon steel (see U.S. Pat. No. 2,992,952). The silicon steel need not be any thicker than is necessary to supply a firm support. Commonly, it is about 10 to about 15 mils thick and is sold in rolls 3 or 4 feet wide which can be cut to desired sizes. Cutting can be performed before or after coating with tungsten and silicon; however, it is usually desirable to make the modules as large as possible as less handling is involved per unit area of solar cell.

The tungsten is deposited from a mixture of hydrogen and tungsten hexafluoride or hexachloride gases. While the hexachloride may be used, the hexafluoride is preferred as lower temperatures are required. The total gas pressure is not considered to be critical, but it is preferably about 0.05 to about 0.15 Torr. The relative pressures of hydrogen and tungsten hexafluoride are critical, however, because if the ratio of the partial pressure of hydrogen to the partial pressure of tungsten hexafluoride is less than about 3, the hydrogen fluoride which results from the deposition reaction, WF$_6$+3H$_2$⇌W+6HF, can attack the steel and prevent an adherent layer of tungsten from forming. On the other hand, if this ratio is significantly greater than about 6, the tungsten hexafluoride tends to decompose in the vapor and not on the steel. A ratio of about 3 to about 6 is preferred. A temperature of about 1300° C. is necessary to produce epitaxial deposition, but higher temperatures are unnecessary. The tungsten is epitaxially deposited at a growth rate of about 200 to about 1000 $\mu$m per hour. Deposition is permitted to continue until the desired thickness is obtained, whence the steel is removed. A tungsten thickness of about 10 to about 50 $\mu$m is usually satisfactory.

The silicon is deposited epitaxially on the layer of tungsten using any of the conventional silicon deposition techniques, such as the pyrolysis of SiH$_4$ (silane) or the use of a mixture of SiHCl$_3$ (trichlorosilane) and hydrogen. For example, chemical vapor deposition at 800° to 1200° C. from a mixture of up to 1% silane in hydrogen with a helium carrier gas produces silicon growth rates of about 0.2 to 0.3 μm per minute. Two layers, a "p" and an "n" layer, are needed. Small additions of phosphine can be added to produce n-type silicon and diborane can be added to produce p-type silicon. The doping of the silicon layer can be graded from high at the back face to low at the top face, so as to provide lower resistivity in the inactive region, and to reduce the recombination of minority current carriers at the back face. The doping level and type selected will depend upon the details of the junction design. Typical thicknesses of the silicon layer are about 30 to about 100 μm.

In order to finish the solar cell a junction is produced in the top silicon layer, and a current collection grid is placed on the top surface. An antireflective coating is usually placed on the junction layer over the grid to increase efficiency. The unit is then encapsulated and is interconnected electrically with adjacent units. Details can be found in "Integrated Circuits, Design Principles and Fabrication," "Motorola Series in Solid-State Electronics," (1965), and elsewhere.

The following example further illustrates this invention.

EXAMPLE

Blanks of silicon steel 10 cm×10 cm and 11 mils (0.028 cm) thick can be cut from a roll of steel. The electrically insulating coating normally present on the surfaces of the steel can be removed by etching so as to provide clean surfaces preparatory to tungsten coating.

A tungsten coating operation may be carried out in a vacuum-tight cold wall furnace in which the blanks are inductively heated directly by a susceptor upon which they rest. The blanks may be placed into the furnace and the furnace sealed. After evacuating and backfilling with hydrogen several times to remove residual air an atmosphere of hydrogen may be introduced and the furnace load may be heated in the range of 800° to 1000° C. for a few minutes in order to remove all traces of surface contamination which may have been present. Following this operation, the hydrogen atmosphere may be partially removed so that the pressure is less than 1 torr. The temperature of the silicon steel blanks may be raised to 1300° C. immediately after the flow of a mixture of hydrogen and tungsten hexafluoride at a ratio of 6:1 is introduced into the furnace at a pressure of 0.1 torr. These conditions may be maintained for approximately 3 minutes or until a tungsten layer thickness in the range of 10 to 50 μm is attained. Thereafter, the reactant gas may be pumped out and the workpieces allowed to cool. The furnace may then be backfilled with hydrogen, opened, and the workpieces removed. The surface of the coated silicon steel blanks is kept clean so as to avoid adverse effects during the subsequent processing.

The blanks may be placed in a vacuum-tight cold wall type furnace in which they are inductively heated either directly or indirectly by a susceptor (a silicon-carbide-coated graphite) upon which they rest. After evacuating and backfilling with hydrogen several times to remove residual air, hydrogen flow may be started at substantially atmospheric pressure and the furnace load may be heated to the chemical vapor deposition temperature (900° C.) in order to reduce any oxide or other contamination on the tungsten surface. After several minutes, silane may be added to the incoming gas flow in a ratio of 1 part silane to 1000 parts hydrogen, and also sufficient diborane may be added to provide the desired p+ doping level. Deposition may be allowed to continue for approximately 10 minutes so that the p+ silicon thickness is in the range of 10 to 20 μm. At that time the diborane feed rate may be reduced so that the deposited silicon is p-type and deposition may be continued until the total thickness of the deposit is 30 to 100 μm. The flow of silane and diborane is stopped, but the hydrogen flow continued, until the workpiece has cooled sufficiently to be removed from the furnace.

The semi-finished solar cell resulting from the foregoing operations may be cleaned by dipping in a 10% solution of hydrogen fluoride in water. It may then be given a diffusion treatment at 850° C. for 35 minutes in a flowing mixture of $POCl_3$, $N_2$, and $O_2$. The gas mixture may be obtained by flowing nitrogen at 200 cc/min through $POCl_3$ (liquid) held at 0° C. and mixing the resultant $POCl_3$-laden nitrogen with a flow of 1560 cc/min of nitrogen and 62.5 cc/min of oxygen. The workpieces may be cooled following the diffusion. The oxide remaining on the surface may be removed by dipping in a 3:1 water hydrogen fluoride solution. The foregoing treatments produce a shallow n-type region on the top surface.

An antireflection coating may be applied by dipping the solar cell in a coating fluid and leveling the adherent liquid by spinning. The coated pieces may then be cured in an oven at 400° C. for 5 minutes.

A photoresist may be applied by dipping and leveling by spinning, then baking at 90° C. for 15 minutes.

The photoresist covered pieces may be exposed through a mask containing the desired pattern of top surface current collectors. Following exposure, the antireflective coating under the masked area (the current collectors) is etched out by dipping in a solution of 150 cc of $H_2O$, 60 cc HCl, and 30 cc ammonium fluoride.

The top side of the workpiece may be metallized by evaporating a thin layer of titanium followed by a thin layer of palladium. This operation covers the entire surface. At the current collector areas, the metallization is directly on the silicon, while in the remaining area the metallization rests on the unetched photo resist. The latter metallization is removed by immersing the workpieces in acetone with gentle agitation. Following removal of the unwanted metallization, the remaining metallization is built up by electroplating silver to a thickness of 4 μm. The completed cells may then be assembled into arrays, electrically interconnected, and encapsulated.

I claim:

1. A method of making a substrate comprising depositing an epitaxial layer of doped silicon on an epitaxial layer of tungsten on a sheet of large grained silicon steel.

2. A method according to claim 1 including the additional last step of providing a pin junction in said layer of silicon.

3. A method according to claim 1 including the additional last step of mounting a current collector on said layer of silicon.

4. A method according to claim 1 wherein said tungsten has a thickness of about 1 to about 20 microns.

5. A method according to claim 1 wherein the amount of silicon in said steel is about 2½ to about 5% by weight.

6. A method according to claim 1 wherein said silicon steel is about 10 to about 15 mils thick.

7. A method according to claim 1 wherein said layer of tungsten is about 1 to about 10 microns thick.

8. A method according to claim 1 wherein said epitaxial layer of tungsten on said sheet of silicon steel was made by heating a sheet of large-grained silicon steel to at least about 1300° C. in an atmosphere of hydrogen and either tungsten hexafluoride or tungsten hexachloride at a partial pressure of hydrogen to said tungsten hexafluoride or hexachloride of about 3 to about 6.

9. A method according to claim 8 wherein the grain size of said silicon steel is at least 10 times the thickness of said layer of silicon.

10. A method according to claim 8 wherein the total pressure of said hydrogen and tungsten hexafluoride or hexachloride is about 0.05 to about 0.15 torr.

11. A method according to claim 8 wherein tungsten hexafluoride is used.

* * * * *